(12) United States Patent
Ishizuka et al.

(10) Patent No.: US 9,197,187 B2
(45) Date of Patent: Nov. 24, 2015

(54) FRONT-END CIRCUIT AND COMMUNICATION TERMINAL APPARATUS

(71) Applicant: Murata Manufacturing Co., Ltd., Nagaokakyo-shi, Kyoto-fu (JP)

(72) Inventors: Kenichi Ishizuka, Nagaokakyo (JP); Noboru Kato, Nagaokakyo (JP); Noriyuki Ueki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/072,818

(22) Filed: Nov. 6, 2013

(65) Prior Publication Data

US 2014/0055209 A1    Feb. 27, 2014

Related U.S. Application Data

(63) Continuation of application No. PCT/JP2012/061339, filed on Apr. 27, 2012.

(30) Foreign Application Priority Data

May 9, 2011    (JP) .................. 2011-103970

(51) Int. Cl.
*H03H 7/38*    (2006.01)
*H03H 7/01*    (2006.01)
(Continued)

(52) U.S. Cl.
CPC . *H03H 7/01* (2013.01); *H03H 7/38* (2013.01); *H03H 7/463* (2013.01); *H04B 1/0057* (2013.01); *H04B 1/0458* (2013.01); *H01F 19/04* (2013.01); *H03H 7/09* (2013.01)

(58) Field of Classification Search
USPC ...................... 333/126–129, 32, 33
See application file for complete search history.

(56) References Cited

U.S. PATENT DOCUMENTS 7,917,096 B2 *   3/2011   Wilcox ............... 455/80
8,754,738 B2 *   6/2014   Kato et al. ............ 336/200
(Continued)

FOREIGN PATENT DOCUMENTS

JP    02-261209 A    10/1990
JP    03-080509 A    4/1991
(Continued)

OTHER PUBLICATIONS

Official Communication issued in International Patent Application No. PCT/JP2012/061339, mailed on Jul. 10, 2012.
(Continued)

*Primary Examiner* — Robert Pascal
*Assistant Examiner* — Kimberly Glenn
(74) *Attorney, Agent, or Firm* — Keating & Bennett, LLP

(57) ABSTRACT

A front-end circuit includes a diplexer and an impedance conversion circuit. The diplexer includes a feeding side common port through which a high-frequency signal in a high band and a high-frequency signal in a low band are input and output, a first port through which a high-frequency signal in a high band is input and output, and a second port through which a high-frequency signal in a low band is input and output, and demultiplexes or multiplexes the high-frequency signal in a low band and the high-frequency signal in a high band. The impedance conversion circuit is connected between the second port of the diplexer and an antenna port. The first port of the diplexer is directly connected to the antenna port through a transmission line.

11 Claims, 23 Drawing Sheets

(51) Int. Cl.
*H03H 7/46* (2006.01)
*H04B 1/00* (2006.01)
*H04B 1/04* (2006.01)
*H01F 19/04* (2006.01)
*H03H 7/09* (2006.01)

(56) References Cited

U.S. PATENT DOCUMENTS

2007/0241985 A1  10/2007  Suzuki et al.
2010/0033398 A1*  2/2010  Jung et al. .................. 343/860

FOREIGN PATENT DOCUMENTS

| | | |
|---|---|---|
| JP | 2000-151446 A | 5/2000 |
| JP | 2003-100518 A | 4/2003 |
| JP | 2004-072445 A | 3/2004 |
| JP | 2007-288361 A | 11/2007 |
| JP | 2008-205991 A | 9/2008 |
| JP | 2012-084833 A | 4/2012 |
| JP | 2012-085250 A | 4/2012 |
| JP | 2012-085305 A | 4/2012 |
| WO | 2009020025 A1 | 2/2009 |

OTHER PUBLICATIONS

Official Communication issued in corresponding Japanese Patent Application No. 2013-513980, mailed on Dec. 2, 2014.
Official Communication issued in corresponding Japanese Patent Application No. 2013-513980, mailed on Jul. 28, 2015.

* cited by examiner

Freq. (700.0MHz to 2.300GHz)

Freq. (800.0MHz to 2.200GHz)

FRONT-END CIRCUIT AND COMMUNICATION TERMINAL APPARATUS

BACKGROUND OF THE INVENTION

1. Field of the Invention

The present invention relates to a front-end circuit provided between a high frequency circuit such as a transmitting and receiving circuit and an antenna, and a communication terminal apparatus equipped with the front-end circuit.

2. Description of the Related Art

Between a high frequency circuit and an antenna, generally, an impedance matching circuit that performs impedance matching between the high frequency circuit and the antenna is provided. For example, since compact communication terminal apparatuses such as mobile phones have a relatively small antenna size for a communication frequency band, the impedance of an antenna tends to be smaller than the characteristic impedance of a feeding circuit. Therefore, a large impedance conversion ratio is required. As a circuit that performs constant impedance conversion, for example, Japanese Patent Laid-Open Publication No. 2004-072445 discloses a transformer-type matching circuit.

In recent years, communication terminal apparatuses, such as mobile phones, may require compatibility with communication systems, such as a GSM (registered trademark) (Global System for Mobile communication), DCS (Digital Communication System), PCS (Personal Communication Services), and UMTS (Universal Mobile Telecommunications System), as well as a GPS (Global Positioning System), a wireless LAN, Bluetooth (registered trademark), and the like. Thus, antenna devices for such communication terminal apparatuses are required to cover a wide frequency band from 800 MHz to 2.4 GHz.

On the other hand, since antennas generally have a frequency characteristic in the impedance, it is difficult to obtain favorable matching in a wide band by using such a transformer-type matching circuit disclosed in Japanese Patent Laid-Open Publication No. 2004-072445, that performs constant impedance conversion.

FIG. 1 illustrates an example of the frequency characteristic of the transformer-type impedance conversion circuit as disclosed in Japanese Patent Laid-Open Publication No. 2004-072445. FIG. 1A illustrates return loss as viewed from a feeding port of an impedance conversion circuit to the antenna side in a frequency range from 700 MHz to 2.3 GHz, and FIG. 1B illustrates an impedance trace on a Smith chart.

This example illustrates the return loss is minimum at about 1.9 GHz, that is, the radiation efficiency from the antenna is maximum, and in other frequencies, for example, in the 800 MHz band, the return loss is large and the radiation efficiency is extremely poor. Therefore, the impedance conversion circuit disclosed in Japanese Patent Laid-Open Publication No. 2004-072445 cannot be used for the above described wideband antenna device.

In addition, the antenna devices for a wide frequency band typically have a wideband matching circuit including an LC parallel resonant circuit or an LC series resonant circuit. However, in the LC circuits, some insertion loss is generated, which generates a signal energy loss.

Depending on arrangement positions of a ground plate, a casing, other closely disposed components (in particular, high frequency components such as an antenna and a strip line), the characteristic of an impedance conversion circuit may change.

SUMMARY OF THE INVENTION

In view of the circumstances described above, preferred embodiments of the present invention provide a front-end circuit in which a high frequency circuit and an antenna are matched with low insertion loss over a wide frequency band, and a communication terminal apparatus equipped with this front-end circuit.

A front-end circuit according to a preferred embodiment of the present invention includes a feeding side frequency selective circuit that includes a feeding side common port through which a high-frequency signal in a first frequency band and a high-frequency signal in a second frequency band of which a frequency band is lower than the first frequency band are input or output; a first port through which a high-frequency signal in the first frequency band is input or output; and a second port through which a high-frequency signal in the second frequency band is input or output, and demultiplexes or multiplexes the high-frequency signal in the first frequency band and the high-frequency signal in the second frequency band; and at least one of a first impedance conversion circuit and a second impedance conversion circuit, the first impedance conversion circuit including a first transformer in which a primary side coil and a secondary side coil are included, the primary side coil including a first end connected to the first port (P1), and a second end connected to a port (Pout) on an antenna side, the secondary side coil including a first end connected to ground, and a second end connected to the port (Pout) on the antenna side, and the primary side coil and the secondary side coil being electromagnetically coupled to each other; and the second impedance conversion circuit including a second transformer in which a primary side coil and a secondary side coil are included, the primary side coil including a first end connected to the second port (P2), and a second end connected to the port (Pout) on the antenna side, the secondary side coil including a first end connected to ground, and a second end connected to the port (Pout) on the antenna side, and the primary side coil and the secondary side coil being electromagnetically coupled to each other.

A front-end circuit according to another preferred embodiment of the present invention includes an antenna side frequency selective circuit that includes an antenna side common port through which a high-frequency signal in a first frequency band and a high-frequency signal in a second frequency band of which a frequency band is lower than the first frequency band are input or output; a first port through which a high-frequency signal in the first frequency band is input or output; and a second port through which a high-frequency signal in the second frequency band is input or output, and demultiplexes or multiplexes the high-frequency signal in the first frequency band and the high-frequency signal in the second frequency band; and at least one of a first impedance conversion circuit and a second impedance conversion circuit, the first impedance conversion circuit including a first transformer in which a primary side coil and a secondary side coil are included, the primary side coil including a first end connected to a first feeding port (Pf1), and a second end connected to the first port (Pa1), the secondary side coil including a first end connected to ground, and a second end connected to the first port (Pa1), and the primary side coil and the secondary side coil being electromagnetically coupled to each other; and the second impedance conversion circuit including a second transformer in which a primary side coil and a secondary side coil are included, the primary side coil including a first end connected to a second feeding port (Pf2), and a second end connected to the second port (Pa2), the secondary side coil including a first end connected to the ground, and a second end connected to the second port (Pa2), and the primary side coil and the secondary side coil being electromagnetically coupled to each other.

A communication terminal apparatus according to a preferred embodiment includes a front-end circuit including a feeding side frequency selective circuit that includes a feeding side common port through which a high-frequency signal in a first frequency band and a high-frequency signal in a second frequency band of which a frequency band is lower than the first frequency band are input or output; a first port through which the high-frequency signal in the first frequency band is input or output; and a second port through which the high-frequency signal in the second frequency band is input or output, and demultiplexes or multiplexes the high-frequency signal in the first frequency band and the high-frequency signal in the second frequency band; at least one of a first impedance conversion circuit and a second impedance conversion circuit, the first impedance conversion circuit including a first transformer in which a primary side coil and a secondary side coil are included, the primary side coil including a first end connected to the first port (P1), and a second end connected to a port (Pout) on an antenna side, the secondary side coil including a first end connected to ground, and a second end connected to the port (Pout) on the antenna side, and the primary side coil and the secondary side coil being electromagnetically coupled to each other; and the second impedance conversion circuit including a second transformer in which a primary side coil and a secondary side coil are included, the primary side coil including a first end connected to the second port (P2), and a second end connected to a port (Pout) on an antenna side, the secondary side coil including a first end connected to ground, and a second end connected to the port (Pout) on the antenna side, and the primary side coil and the secondary side coil being electromagnetically coupled to each other; and a high frequency circuit connected to the feeding side common port.

A communication terminal apparatus according to another preferred embodiment of the present invention includes a front-end circuit including an antenna side frequency selective circuit that includes an antenna side common port through which a high-frequency signal in a first frequency band and a high-frequency signal in a second frequency band of which a frequency band is lower than the first frequency band are input or output; a first port through which a high-frequency signal in the first frequency band is input or output; and a second port through which a high-frequency signal in the second frequency band is input or output, and demultiplexes or multiplexes the high-frequency signal in the first frequency band and the high-frequency signal in the second frequency band; at least one of a first impedance conversion circuit and a second impedance conversion circuit, the first impedance conversion circuit including a first transformer in which a primary side coil and a secondary side coil are included, the primary side coil including a first end connected to a first feeding port (Pf1), and a second end connected to the first port (Pa1), the secondary side coil including a first end connected to ground, and a second end connected to the first port (Pa1), and the primary side coil and the secondary side coil being electromagnetically coupled to each other; and the second impedance conversion circuit including a second transformer in which a primary side coil and a secondary side coil are included, the primary side coil including a first end connected to a second feeding port (Pf2), and a second end connected to the second port (Pa2), the secondary side coil including a first end connected to the ground, and a second end connected to the second port (Pa2), and the primary side coil and the secondary side coil being electromagnetically coupled to each other; a high frequency circuit connected to the first impedance conversion circuit; and a high frequency circuit connected to the second impedance conversion circuit.

According to various preferred embodiments of the present invention, a front-end circuit in which a high frequency circuit and an antenna are matched with low insertion loss over a wide frequency band, with a simple circuit configuration, and a communication terminal apparatus equipped with this front-end circuit is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
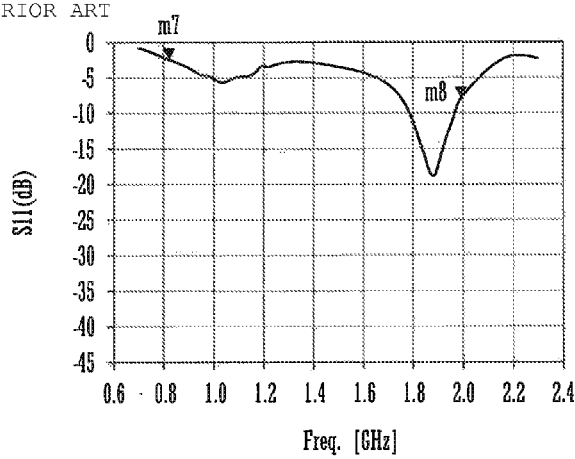
FIG. 1A illustrates return loss as viewed from a feeding port of a transformer-type impedance conversion circuit disclosed in Japanese Patent Laid-Open Publication No. 2004-072445 to an antenna.
Figure 1B:
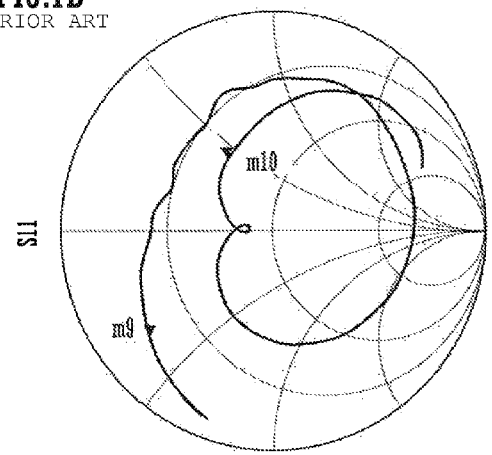
FIG. 1B illustrates, on a Smith chart, an impedance trace.
Figure 2:
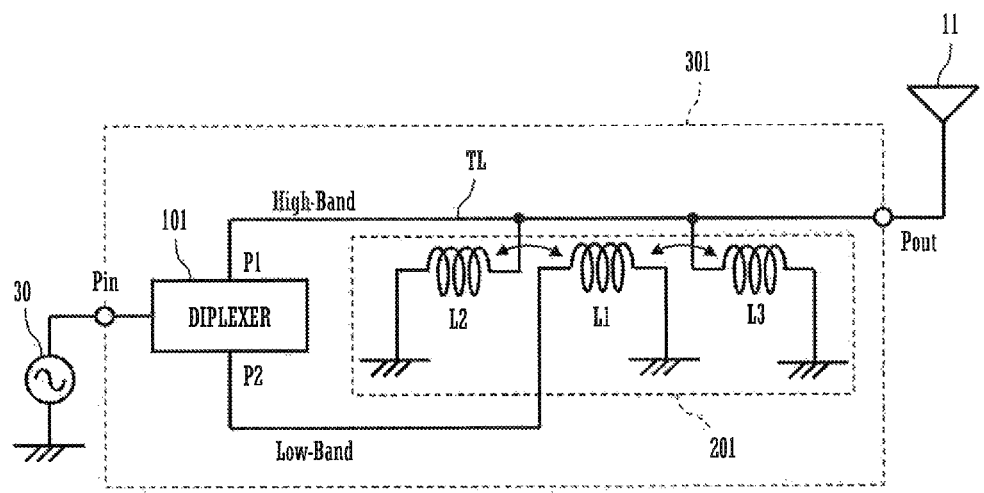
FIG. 2 is a circuit diagram of a front-end circuit according to a first preferred embodiment of the present invention, and a main portion of a communication terminal apparatus equipped with the front-end circuit.

FIG. 2 is a circuit diagram of a front-end circuit according to a first preferred embodiment of the present invention, and a main portion of a communication terminal apparatus equipped with the front-end circuit. The front-end circuit 301 according to the first preferred embodiment includes a feeding side common port Pin and an antenna port Pout, a high frequency circuit 30 is connected to the feeding side common port Pin, and an antenna (a radiating element) 11 is connected to the antenna port Pout. The front-end circuit 301 includes a feeding side frequency selective circuit (hereinafter referred to a "diplexer") 101 and an impedance conversion circuit 201.

The diplexer 101 includes a feeding side common port Pin through which a high-frequency signal in a 2 GHz frequency band as a first frequency band (hereinafter referred to a "high band") and a high-frequency signal in 800 MHz frequency band as a second frequency band (hereinafter referred to a "low band") that is lower than the first frequency band are input or output; a first port P1 through which a high-frequency signal in a high band is input or output; and a second port P2 through which a high-frequency signal in a low band is input or output, and demultiplexes or multiplexes the high-frequency signal in a low band and the high-frequency signal in a high band.

The impedance conversion circuit 201 is connected between the second port P2 of the diplexer 101 and the antenna port Pout. In addition, the first port P1 of the diplexer 101 is directly connected to the antenna port Pout through a transmission line TL.

The impedance conversion circuit 201 includes a first circuit (a primary side circuit) including a first coil element L1, and a second circuit (a secondary side circuit) including a second coil element L2 and a third coil element L3 that is connected to the second coil element in series. The first coil element L1 corresponds to a primary side coil, and the second coil element L2 and the third coil element L3 correspond to a secondary side coil. The first coil element L1 and the second coil element L2 are electromagnetically coupled to each other in an opposite phase, and the first coil element L1 and the third coil element L3 are electromagnetically coupled to each other in an opposite phase. In addition, the first coil element L1, the second coil element L2, and the third coil element L3 are arranged so that respective winding axes of the coil elements are along or substantially along the same straight line and the first coil element L1 may be positioned between the second coil element L2 and the third coil element L3. Furthermore, the first coil element L1, the second coil element L2, and the third coil element L3 are integrally configured in a multilayer substrate as a laminate including a plurality of dielectric layers or magnetic layers, and at least a region of coupling between the first coil element L1 and the second coil element L2 and a region of coupling between the first coil element L1 and the third coil element L3 are positioned in the multilayer substrate.

Since the closed magnetic circuit for the magnetic flux generated in the first coil element L1 and the closed magnetic circuit for the magnetic flux generated in the second coil element L2 repel each other, an equivalent magnetic barrier is generated between the first coil element L1 and the second coil element L2. Similarly, since the closed magnetic circuit for the magnetic flux generated in the first coil element L1 and the closed magnetic circuit for the magnetic flux generated in the third coil element L3 repel each other, an equivalent magnetic barrier is generated between the first coil element L1 and the third coil element L3. In this way, the impedance conversion circuit 201 defines a transformer-type impedance conversion circuit.

The diplexer 101 demultiplexes/multiplexes a high-frequency signal in a high band and a high-frequency signal in a low band. The high-frequency signal in a low band propagates through the impedance conversion circuit 201, and the high-frequency signal in a high band propagates through the transmission line TL.

Portable communication terminal apparatuses such as a mobile terminal, since the length of a casing is less than a quarter wavelength in a low band (for example, 800 MHz frequency band), tend to have low impedance. In a high band (for example, 2 GHz frequency band), impedance equivalent to the impedance of a monopole antenna can be obtained. For example, the impedance in a high band is about 25Ω and the impedance in a low band is about 8Ω. In this case, if the impedance of the high frequency circuit 30 is about 50Ω, the impedance conversion ratio of the impedance conversion circuit 201 may be set to about 50:8, for example. Thus, the impedance matching of a high-frequency signal in a low band is normally performed in the impedance conversion circuit 201. Since the high-frequency signal in a high band does not pass through the impedance conversion circuit 201, impedance does not become too high, and can be matched to such an extent that no problems in use would occur.

Figure 3A:
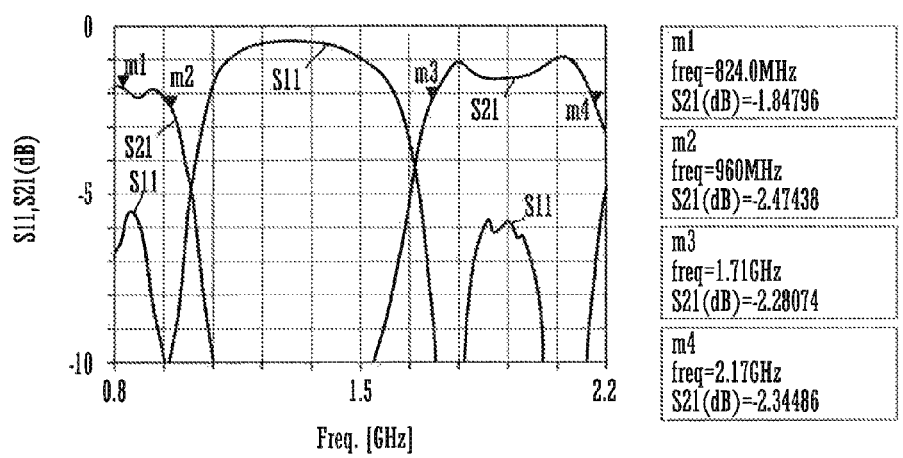
FIG. 3A is a characteristic figure of return loss and insertion loss as viewed from a feeding side common port Pin to the antenna in the front-end circuit 301 according to the first preferred embodiment.
Figure 3B:
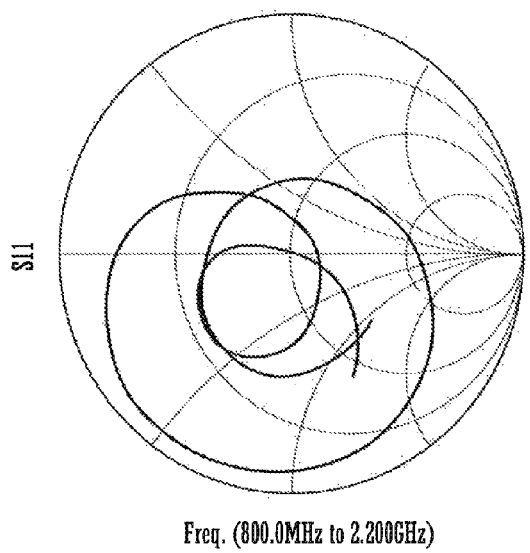
FIG. 3B illustrates, on a Smith chart, an impedance trace.

FIGS. 3A and 3B illustrates an example of the frequency characteristic of a front-end circuit 301 according to the first preferred embodiment. FIG. 3A is a characteristic figure of insertion loss and return loss as viewed from a feeding side common port Pin to an antenna side in the front-end circuit 301 in a range from 800 MHz to 2.2 GHz, for example. In FIG. 3A, S11 represents return loss and S21 represents insertion loss, respectively. FIG. 3B illustrates, on a Smith chart, an impedance trace.

A real part of the impedance at 820 MHz of the antenna 11, which is usually used, is about 7.7Ω, the characteristic of a low band (820 MHz frequency band, for example) is a characteristic through the impedance conversion circuit 201 of the front-end circuit 301, for example. Then, an output impedance of this impedance conversion circuit 201 matches an input impedance of the diplexer 101. On the other hand, in a high band (1.9 GHz frequency band, for example), an antenna side impedance of a high pass filter of the diplexer 101 matches the characteristic impedance of the antenna.

As described above, the characteristics of low reflection and low insertion loss are achieved for both a low band (for example, 820 MHz frequency band) and a high band (for example, 1.9 GHz frequency band).

Second Preferred Embodiment

Figure 4:
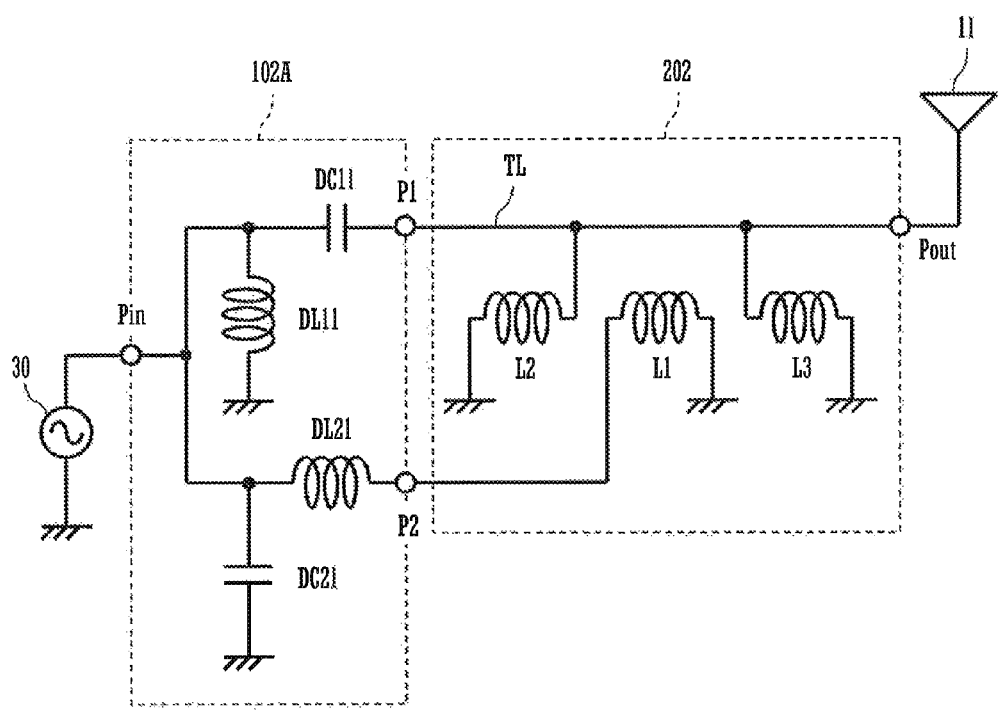
FIG. 4 is a circuit diagram of a front-end circuit of a second preferred embodiment of the present invention, and a main portion of a communication terminal apparatus equipped with the front-end circuit.
Figure 5:
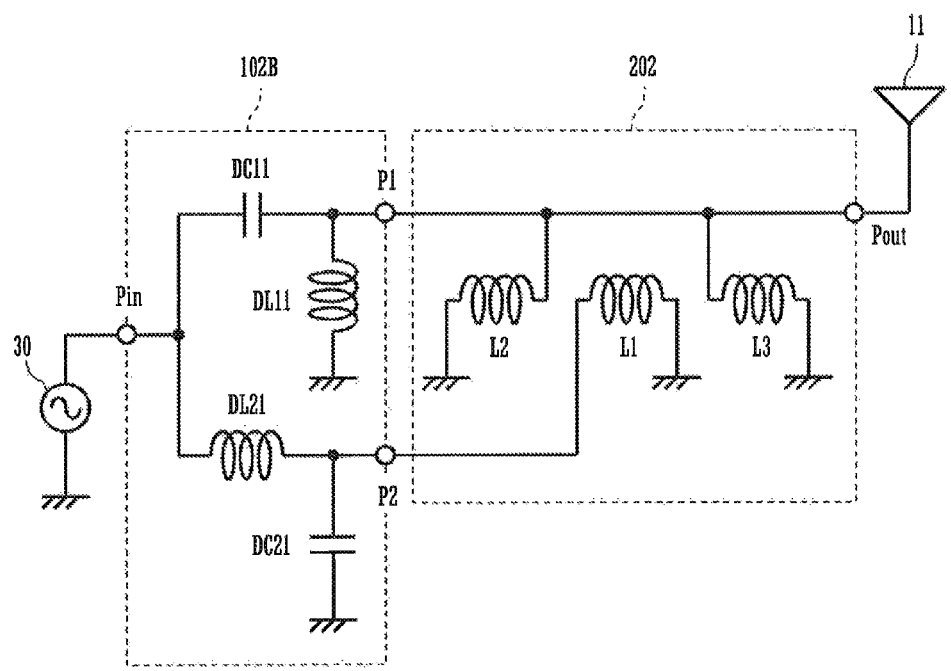
FIG. 5 is a circuit diagram of another front-end circuit of the second preferred embodiment, and a main portion of a communication terminal apparatus equipped with the front-end circuit.

FIG. 4 is a circuit diagram of a front-end circuit of a second preferred embodiment of the present invention, and a main portion of a communication terminal apparatus equipped with the front-end circuit. FIG. 5 is also a circuit diagram of another front-end circuit of the second preferred embodiment, and a main portion of a communication terminal apparatus equipped with the front-end circuit.

In the example illustrated in FIG. 4, the front-end circuit preferably includes a diplexer 102A and an impedance conversion circuit 202. The diplexer 102A includes a high pass filter defined by a capacitor DC11 and an inductor DL11, and a low pass filter defined by an inductor DL21 and a capacitor DC21. This diplexer 102A includes a feeding side common port Pin through which a high-frequency signal in a high band and a high-frequency signal in a low band are input and output; a first port P1 through which a high-frequency signal in a high band is input and output; and a second port P2 through which a high-frequency signal in a low band is input and output, and multiplexes or demultiplexes the high-frequency signal in a low band and the high-frequency signal in a high band.

While the configuration of a transformer portion of the impedance conversion circuit 202 is preferably the same as the configuration described in the first preferred embodiment, in the example illustrated in FIG. 4, a transmission line TL is also included and integrated. The first coil element L1, the second coil element L2, and the third coil element L3 of this impedance conversion circuit 202 are integrally configured in a multilayer substrate as a laminate including a plurality of dielectric layers or magnetic layers. At least a region of coupling between the first coil element L1 and the second coil element L2 and a region of coupling between the first coil element L1 and the third coil element L3 are positioned in the multilayer substrate. In addition, the capacitors DC11 and DC21 and the inductors DL11 and DL21 of the diplexer 102A may mount a chip component on the surface of the multilayer substrate, respectively, or may be integrally configured in the multilayer substrate by a conductor pattern. In any case, a modularized front-end circuit can be defined.

In the example illustrated in FIG. 5, the front-end circuit preferably includes a diplexer 102B and an impedance conversion circuit 202. The diplexer 102B includes a high pass filter defined by the capacitor DC11 and the inductor DL11, and a low pass filter defined by the inductor DL21 and the capacitor DC21. The difference between the diplexer 102B and the diplexer 102A in FIG. 4 is the way the capacitor and the inductor are connected. FIG. 4 illustrates a circuit when the impedance of the first port P1 is higher than the impedance of the feeding side common port Pin in a high band and the impedance of the second port P2 is lower than the impedance of the feeding side common port Pin in a low band. FIG. 5 illustrates a circuit when the impedance of the first port P1 is lower than the impedance of the feeding side common port Pin in a high band and the impedance of the second port P2 is higher than the impedance of the feeding side common port Pin in a low band.

Third Preferred Embodiment

Figure 6A:
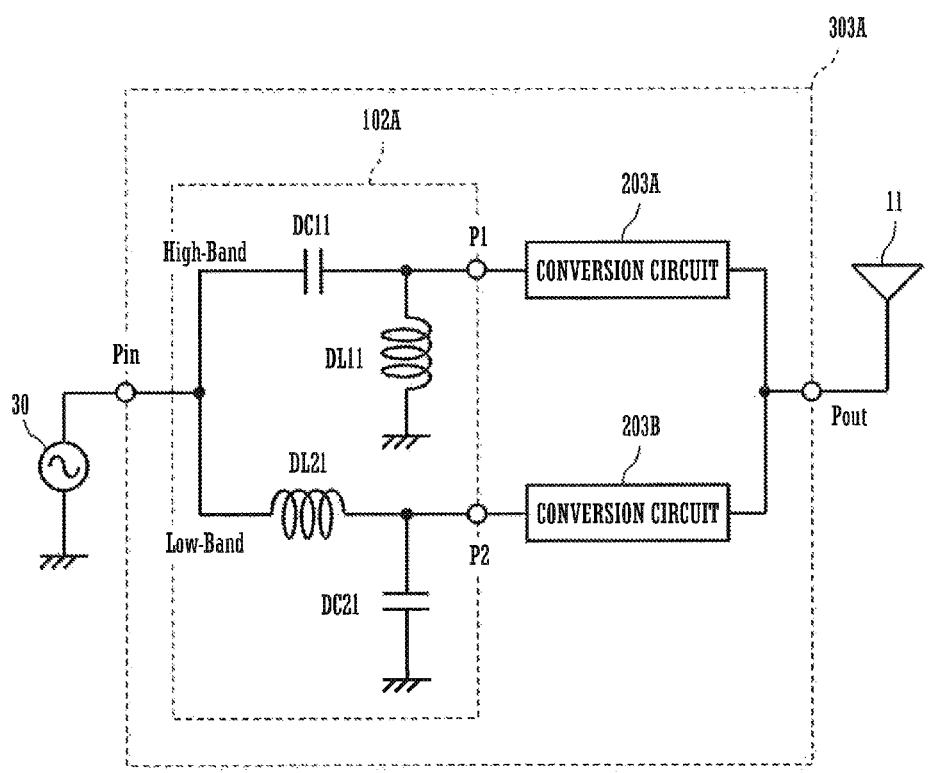
FIG. 6A is a circuit diagram of a front-end circuit of a third preferred embodiment of the present invention, and a main portion of a communication terminal apparatus equipped with the front-end circuit.
Figure 6B:
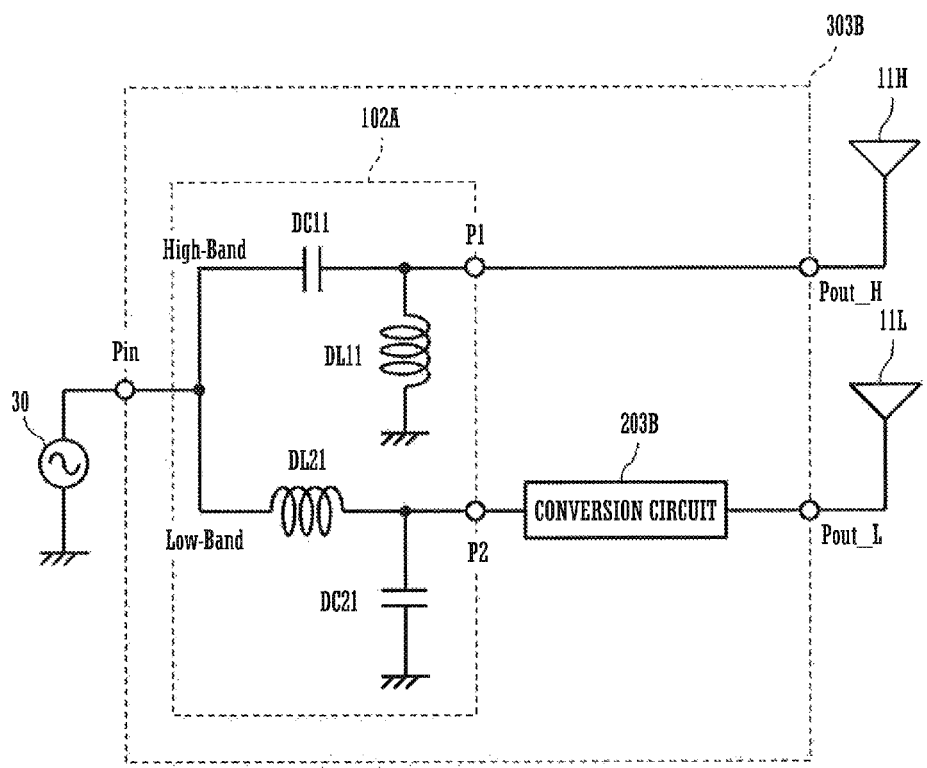
FIG. 6B is a circuit diagram of another front-end circuit of the third preferred embodiment, and a main portion of a communication terminal apparatus equipped with the front-end circuit.
Figure 7:
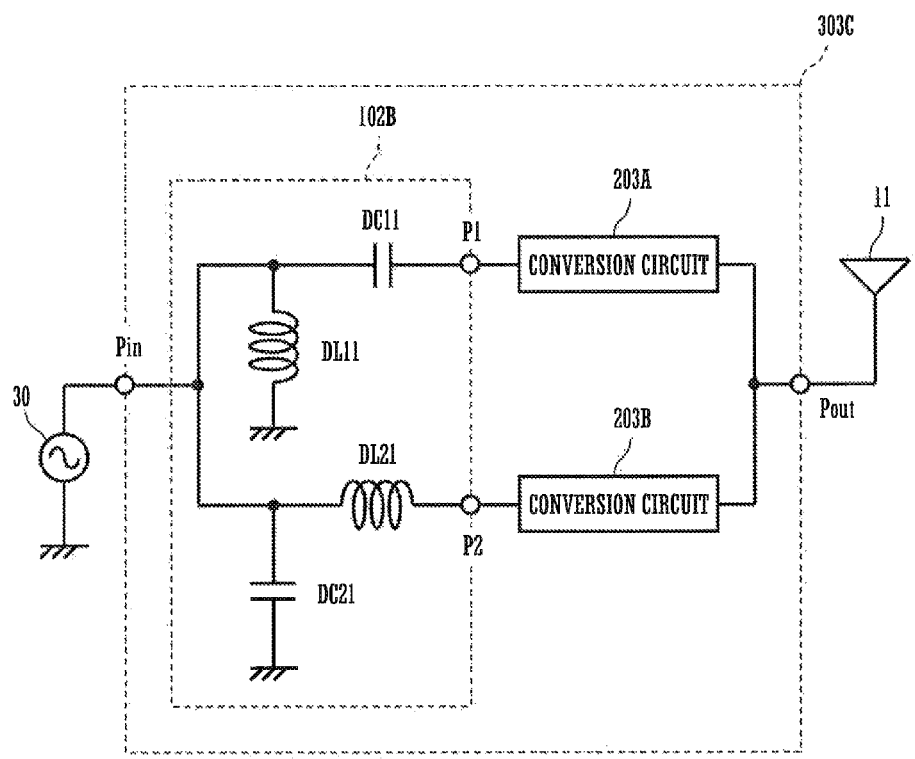
FIG. 7 is a circuit diagram of further another front-end circuit of the third preferred embodiment, and a main portion of a communication terminal apparatus equipped with the front-end circuit.

FIG. 6A is a circuit diagram of a front-end circuit of a third preferred embodiment of the present invention, and a main portion of a communication terminal apparatus equipped with the front-end circuit. FIG. 6B is a circuit diagram of another front-end circuit of the third preferred embodiment, and a main portion of a communication terminal apparatus equipped with the front-end circuit. FIG. 7 is a circuit diagram of further another front-end circuit of the third preferred embodiment, and a main portion of a communication terminal apparatus equipped with the front-end circuit.

In FIG. 6A, a front-end circuit 303A preferably includes a diplexer 102A, a first impedance conversion circuit 203A, and a second impedance conversion circuit 203B. The first impedance conversion circuit 203A is connected to a first port P1 of the diplexer 102A, and the second impedance conversion circuit 203B is connected to a second port P2 of the diplexer 102A.

A high-frequency signal in a high band is input to and output from the port P1 of the diplexer 102A, and passes through the first impedance conversion circuit 203A. A high-frequency signal in a low band is input to and output from the port P2 of the diplexer 102A, and passes through the second impedance conversion circuit 203B.

The first impedance conversion circuit 203A has an impedance conversion ratio that is set to match the impedance of an antenna 11 in a high band. Similarly, the second impedance conversion circuit 203B has an impedance conversion ratio that is set to match the impedance of an antenna 11 in a low band. For example, if the impedance of the antenna 11 in a high band is about 25Ω, the impedance in a low band is about 8Ω, and the impedance of a high frequency circuit 30 is about 50Ω, the impedance conversion ratio of the impedance conversion circuit 203A is preferably set to approximately 50:25 and the impedance conversion ratio of the impedance conversion circuit 203B preferably is set to about 50:8.

As described previously, in portable communication terminal apparatuses such as a mobile terminal, in a case in which the length of a casing is less than a quarter wavelength in a low band (for example, 800 MHz frequency band), the impedance conversion ratio of the impedance conversion circuit for a low band is larger than the impedance conversion ratio of the impedance conversion circuit for a high band.

In FIG. 6B, the front-end circuit 303B preferably includes a diplexer 102A and an impedance conversion circuit 203B. Unlike the front-end circuit and the communication terminal apparatus equipped with the front-end circuit that are illustrated in FIG. 6A, the front-end circuit 303B preferably has no impedance conversion circuit 203A for a high band, but includes the impedance conversion circuit 203B for a low band, and also includes an antenna port Pout_H for a high band and an antenna port Pout_L for a low band separately.

Generally, while a high-frequency signal in a high band has a short wavelength, easily ensures a sufficient length as an antenna element, and easily obtains matching, an antenna element for a low band is hard to ensure a sufficient length and is also hard to perform matching in response to a request of miniaturization. Accordingly, as illustrated in FIG. 6B, only a high frequency circuit for a low band may include the impedance conversion circuit 203B. In addition, an antenna port Pout_H for a high band and an antenna port Pout_L for a low band may be separately provided and may be connected to an antenna 11H for a high band and an antenna 11L for a low band, respectively.

The front-end circuit 303C illustrated in FIG. 7 preferably includes a diplexer 102B and impedance conversion circuits 203A and 203B. Only the configuration of the diplexer is different, and the basic operational effects and advantages are the same as what are illustrated in FIG. 6A.

Fourth Preferred Embodiment

Figure 8:
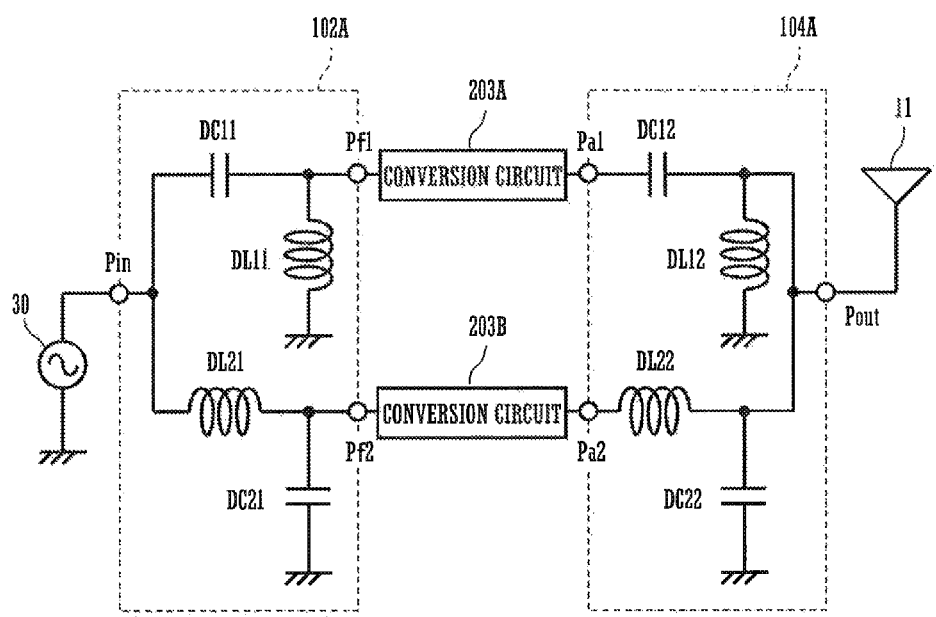
FIG. 8 is a circuit diagram of a front-end circuit of a fourth preferred embodiment of the present invention, and a main portion of a communication terminal apparatus equipped with the front-end circuit.
Figure 9:
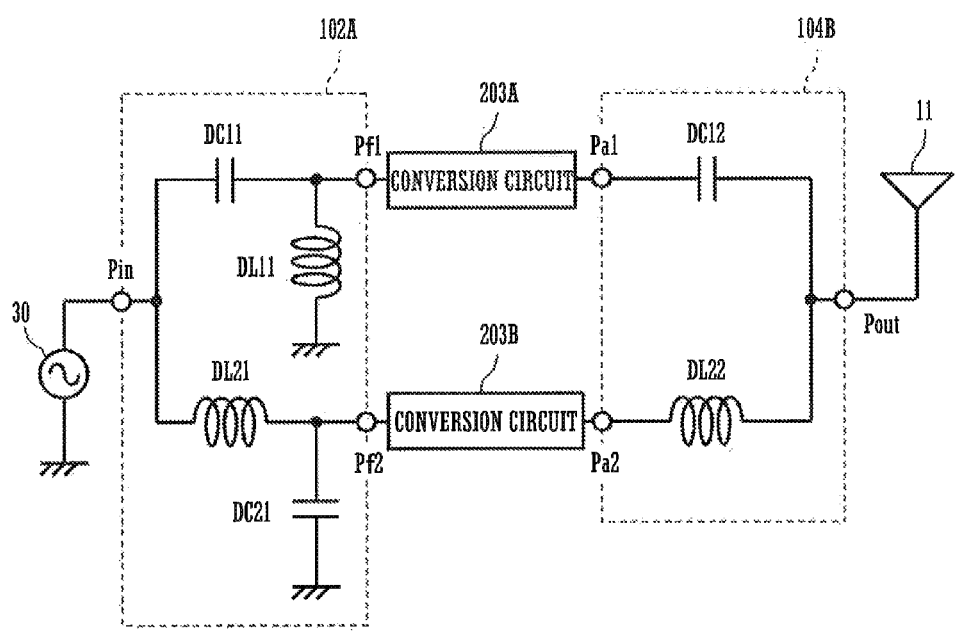
FIG. 9 is a circuit diagram of another front-end circuit of the fourth preferred embodiment, and a main portion of a communication terminal apparatus equipped with the front-end circuit.

FIG. 8 is a circuit diagram of a front-end circuit of a fourth preferred embodiment of the present invention, and a main portion of a communication terminal apparatus equipped with the front-end circuit. FIG. 9 is also a circuit diagram of another front-end circuit of the fourth preferred embodiment, and a main portion of a communication terminal apparatus equipped with the front-end circuit.

In the example illustrated in FIG. 8, a diplexer 102A, impedance conversion circuits 203A and 203B, and an antenna side frequency selective circuit (hereinafter referred to a "diplexer") 104A define a front-end circuit. The first impedance conversion circuit 203A is connected to a first port Pf1 of the diplexer 102A on a feeding side, and the second impedance conversion circuit 203B is connected to a second port Pf2 of the diplexer 102A. The diplexer 104A on an antenna side includes a high pass filter defined by a capacitor DC12 and an inductor DL12, and a low pass filter defined by an inductor DL22 and a capacitor DC22. This diplexer 104A on the antenna side includes an antenna side common port Pout; a first port Pa1 through which a high-frequency signal in a high band is input or output; and a second port Pa2 through which a high-frequency signal in a low band is input or output, and demultiplexes or multiplexes the high-frequency signal in a high band and the high-frequency signal in a low band.

In the example illustrated in FIG. 9, the diplexer 104B on the antenna side preferably includes a capacitor DC12 and an inductor DL22. The basic operational effects and advantages are the same as what are illustrated in FIG. 9. In this way, a diplexer may also be provided on the antenna side.

Fifth Preferred Embodiment

Figure 10:
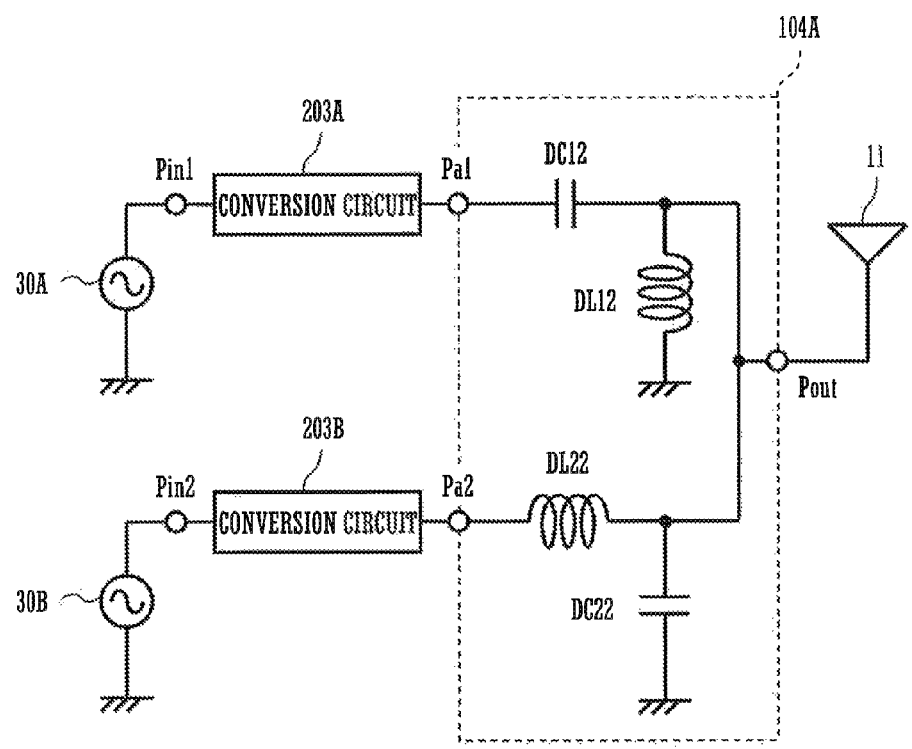
FIG. 10 is a circuit diagram of a front-end circuit of a fifth preferred embodiment of the present invention, and a main portion of a communication terminal apparatus equipped with the front-end circuit.

FIG. 10 is a circuit diagram of a front-end circuit of a fifth preferred embodiment of the present invention, and a main portion of a communication terminal apparatus equipped with the front-end circuit. In this example, impedance conversion circuits 203A and 203B and a diplexer 104A on an antenna side define a front-end circuit. The diplexer 104A on the antenna side includes an antenna side common port Pout; a first port Pa1 through which a high-frequency signal in a high band is input or output; and a second port Pa2 through which a high-frequency signal in a low band is input or output, and demultiplexes or multiplexes the high-frequency signal in a high band and the high-frequency signal in a low band.

Between the first port Pa1 and a first feeding port Pin1, the first impedance conversion circuit 203A for a high band is connected. Similarly, between the second port Pa2 and a second feeding port Pin2, the second impedance conversion circuit 203B for a low band is connected.

A high frequency circuit 30A for a high band is connected to the first feeding port Pin1. Similarly, a high frequency circuit 30B for a low band is connected to the second feeding port Pin2. Then, an antenna 11 is connected to the antenna side common port Pout.

The first impedance conversion circuit 203A includes a first transformer in which a primary side coil and a secondary side coil are electromagnetically coupled to each other. Similarly, the second impedance conversion circuit 203B includes a second transformer in which a primary side coil and a secondary side coil are electromagnetically coupled to each other. The first impedance conversion circuit 203A has an impedance conversion ratio that is set to match the impedance of an antenna 11 in a high band. Similarly, the second impedance conversion circuit 203B has an impedance conversion ratio that is set to match the impedance of the antenna 11 in a low band. In this way, a diplexer may be provided only on the antenna side.

It is to be noted at least one of the first impedance conversion circuit 203A and the second impedance conversion circuit 203B may preferably be provided. For example, in a case in which, in a high band, the antenna 11 and the high frequency circuit 30A match to such an extent that no problems in use of return loss would occur, the first impedance conversion circuit 203A for a high band may not be provided and only the second impedance conversion circuit 203B for a low band may preferably be provided.

Sixth Preferred Embodiment

Figure 11:
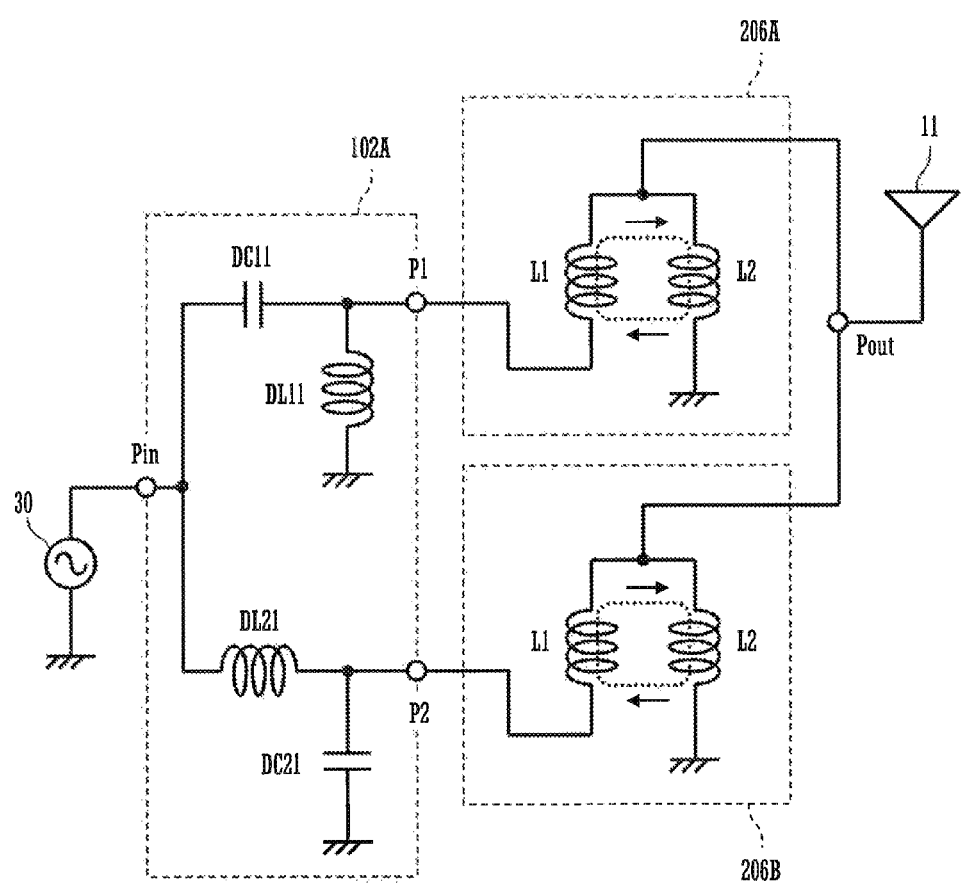
FIG. 11 is a circuit diagram of a front-end circuit of a sixth preferred embodiment of the present invention, and a main portion of a communication terminal apparatus equipped with the front-end circuit.

FIG. 11 is a circuit diagram of a front-end circuit of a sixth preferred embodiment of the present invention, and a main portion of a communication terminal apparatus equipped with the front-end circuit. In this example, impedance conversion circuits 206A and 206B and a diplexer 102A on a feeding side define a front-end circuit.

The impedance conversion circuits 206A and 206B each include a first coil element L1 and a second coil element L2. The first coil element L1 corresponds to a primary side coil, and the second coil element L2 corresponds to a secondary side coil. The first coil element L1 and the second coil element L2 are arranged to define a closed magnetic circuit. Then, the first coil element L1 and the second coil element L2 are connected so that the first coil element L1 and the second coil element L2 are electromagnetically coupled to each other in an opposite phase. Furthermore, the first coil element L1 and the second coil element L2 are integrally configured in a multilayer substrate as a laminate including a plurality of dielectric layers or magnetic layers, and a region of coupling between the first coil element L1 and the second coil element L2 is positioned in the multilayer substrate.

Figure 12A:
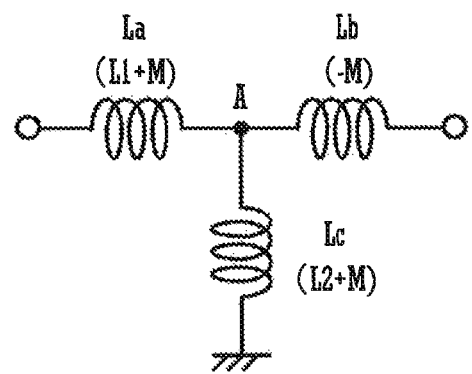
FIG. 12A is an equivalent circuit diagram illustrating the impedance conversion circuits 206A and 206B in FIG. 11.
Figure 12B:
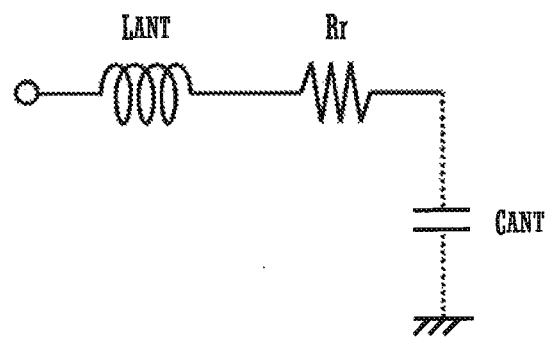
FIG. 12B is an equivalent circuit diagram of an antenna 11.

FIG. 12A is an equivalent circuit diagram illustrating the impedance conversion circuits 206A and 206B in FIG. 11, and FIG. 12B is an equivalent circuit diagram of an antenna 11. Each of the impedance conversion circuits 206A and 206B, as illustrated in FIG. 12A, can be equivalently transformed into a T-type circuit including three inductance elements La, Lb, and Lc. Specifically, this T-type circuit includes the first inductance element La connected between a port on a feeding side and a branch point A, the second inductance element Lb connected between a port on an antenna side and the branch point A, and the third inductance element Lc connected between a ground port and the branch point A.

On the other hand, as illustrated in FIG. 12B, the antenna 11 is equivalently defined by an inductance component LANT, a radiation resistance component Rr, and a capacitance component CANT generated between a radiating element and ground.

The first coil element L1 and the second coil element L2 are coupled to each other to generate a mutual inductance M. A function achieved by the first coil element L1 and the second coil element L2 is, to begin with, to perform impedance conversion so that a real part of the impedance on the side of the feeding circuit (on the side of a high frequency circuit) match a real part of the impedance on the side of the antenna. In many cases, the impedance on the side of the feeding circuit is set to about 50Ω while the impedance of the antenna 11 is often lower than about 50Ω, for example.

The impedance conversion ratio of the impedance conversion circuit is (L1+L2+2M):L2. By the impedance conversion of this impedance conversion circuit, the radiation resistance Rr of the antenna 11 is matched with the impedance (about 50Ω) of the high frequency circuit on the feeding side. In other words, the impedance conversion circuit 206A illustrated in FIG. 11 has an impedance conversion ratio that is set to match the real part of the impedance of the antenna 11 in a high band. Similarly, the impedance conversion circuit 206B has an impedance conversion ratio that is set to match the real part of the impedance of the antenna 11 in a low band.

In addition, the inductance component LANT of the antenna 11 alone acts so as to be canceled by a negative inductance component (−M) in the impedance conversion circuits 206A and 206B. In other words, the inductance component (of the antenna 11 including the second inductance element Lb), when the antenna 11 side is viewed from a point A in FIG. 12A, is reduced (ideally, to zero), and consequently, the impedance frequency characteristic of this antenna is reduced. The impedance conversion circuit 206A illustrated in FIG. 11 has a mutual inductance M that is set to cancel the inductance component of the antenna 11 in a high band. Similarly, the impedance conversion circuit 206B has a mutual inductance M that is set to cancel the inductance component of the antenna 11 in a low band.

Seventh Preferred Embodiment

Figure 13:
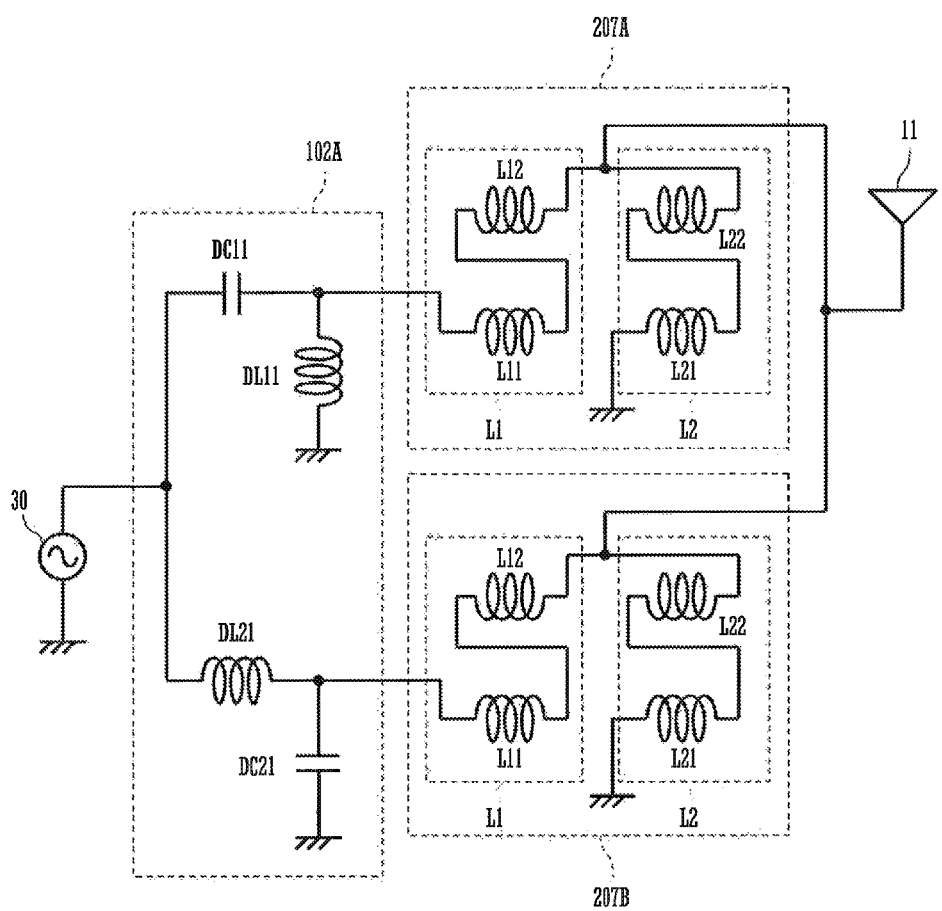
FIG. 13 is a circuit diagram of a front-end circuit of a seventh preferred embodiment of the present invention, and a main portion of a communication terminal apparatus equipped with the front-end circuit.

FIG. 13 is a circuit diagram of a front-end circuit of a seventh preferred embodiment of the present invention, and a main portion of a communication terminal apparatus equipped with the front-end circuit. Compared to the front-end circuit illustrated in FIG. 11, this front-end circuit includes an impedance conversion circuit having a different configuration.

The impedance conversion circuit 207A, as illustrated in FIG. 13, includes a first coil L1 and a second coil L2. The first coil L1 includes two coil elements L11 and L12 that are connected in series. The second coil L2 includes two coil elements L21 and L22 that are connected in series. The impedance conversion circuit 207B, as well as the impedance conversion circuit 207A, includes the first coil L1 and the second coil L2. Then, the first coil L1 includes two coil elements L11 and L12 that are connected in series, and the second coil L2 includes two coil elements L21 and L22 that are connected in series.

Figure 14:
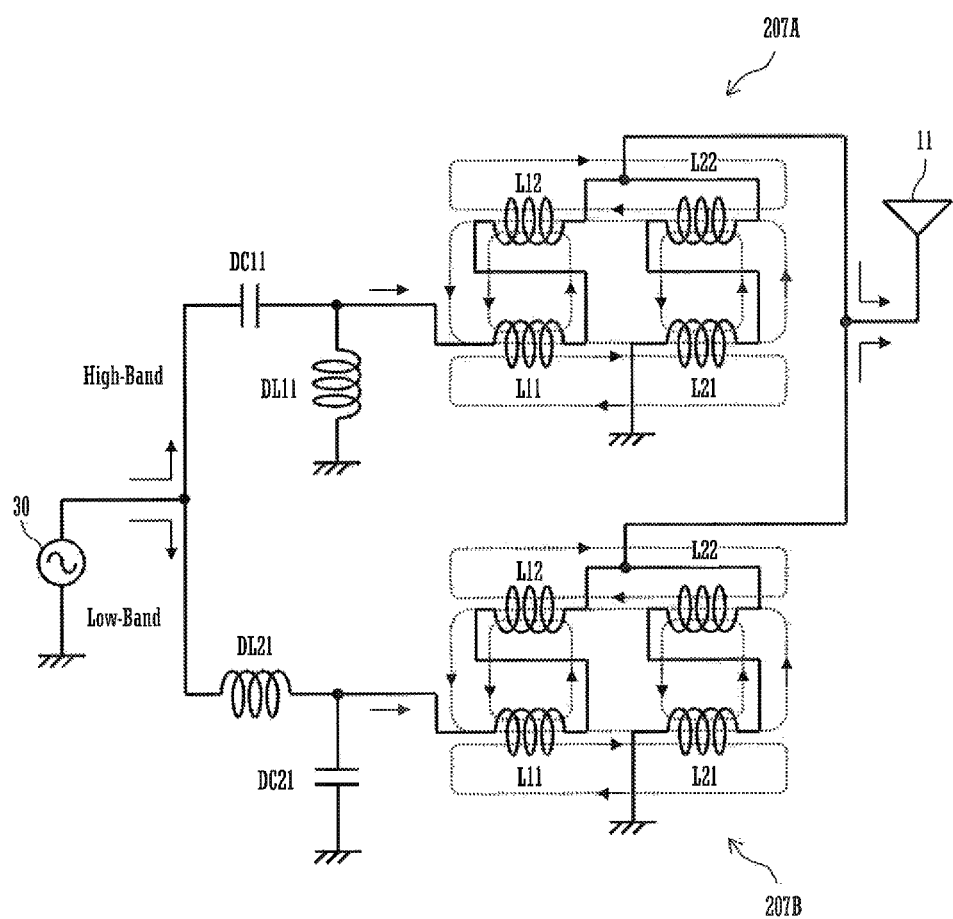
FIG. 14 is a view illustrating the relationship between a current flowing into impedance conversion circuits 207A and 207B and a direction of a current and a magnetic flux.

FIG. 14 is a view illustrating the relationship between a current flowing into the impedance conversion circuits 207A and 207B and a direction of a current and a magnetic flux. In FIG. 14, a current is indicated by an arrow of a solid line and a magnetic flux is indicated by an arrow of a dashed line.

The coil elements L11 and L12 that are connected in series define a closed magnetic circuit, and similarly the coil elements L21 and L22 that are connected in series define a closed magnetic circuit. In addition, the coil elements L11 and L21 define a closed magnetic circuit, and the coil elements L12 and L22 also define a closed magnetic circuit. Furthermore, the entire coil elements L11, L21, L22, and L12 also define a closed magnetic circuit. With such a structure, the coil elements are tightly coupled, which reduces a leakage magnetic flux, makes a degree of coupling between a primary transformer and a secondary transformer significantly high (k=0.5 or more, or, further, 0.7 or more), and significantly reduce or minimize insertion loss. The impedance conversion characteristic of the impedance conversion circuit is negligibly affected by the periphery environment of this circuit.

Eighth Preferred Embodiment

Figure 15:
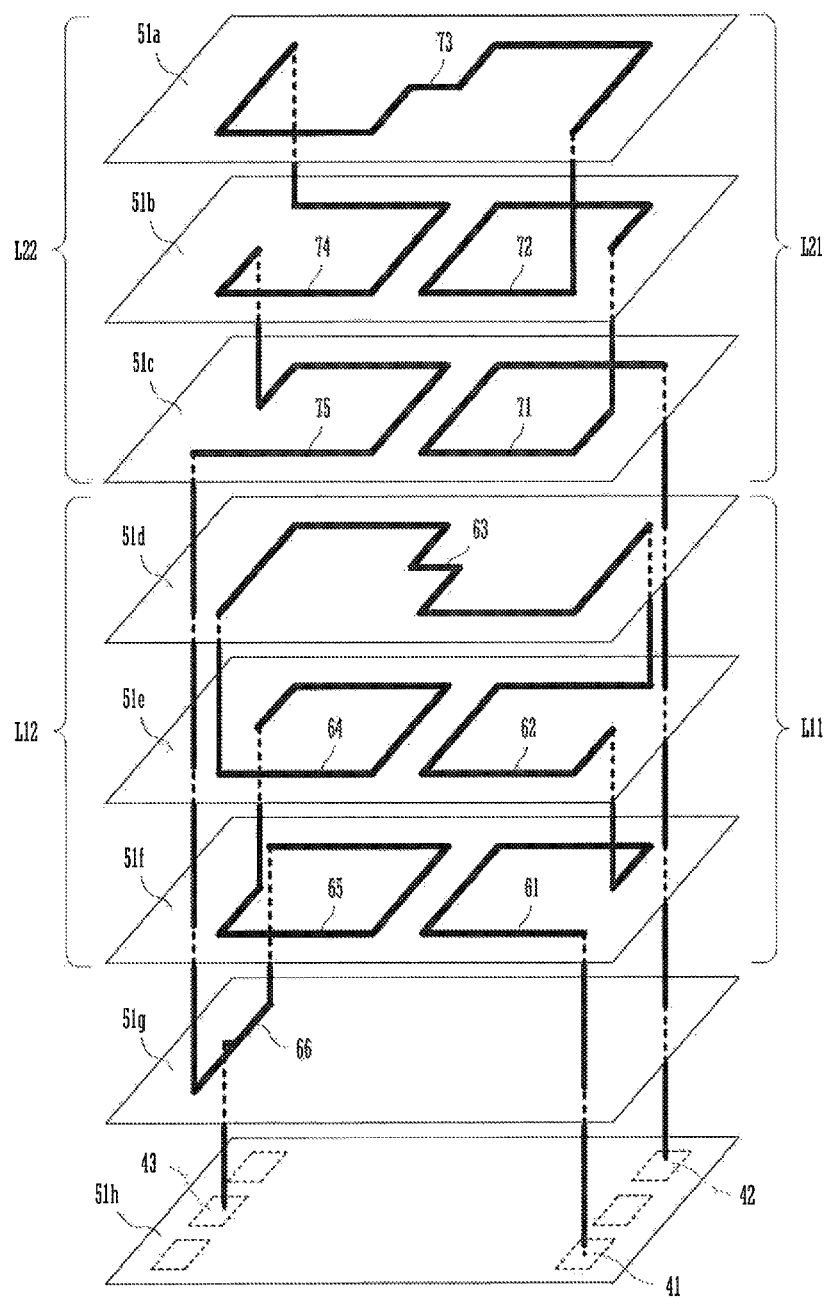
FIG. 15 is a view illustrating an example of conductor patterns of individual layers of an impedance conversion circuit, configured in a multilayer substrate, according to an eighth preferred embodiment of the present invention.

FIG. 15 is a view illustrating an example of conductor patterns of individual layers of an impedance conversion circuit, configured in a multilayer substrate, according to an eighth preferred embodiment of the present invention. Each layer of the laminate is preferably made of a magnetic sheet, for example. This impedance conversion circuit preferably is an impedance conversion circuit for a high band or for a low band.

In the area illustrated in FIG. 15, a conductor pattern 73 is provided on a first layer 51a, conductor patterns 72 and 74 are provided on a second layer 51b, conductor patterns 71 and 75 are provided on a third layer 51c, respectively. Similarly, a conductor pattern 63 is provided on a fourth layer 51d, conductor patterns 62 and 64 are provided on a fifth layer 51e, conductor patterns 61 and 65 are provided on a sixth layer 51f, respectively. Conductor pattern 66 is provided on a seventh layer 51g. A feeding terminal 41, a ground terminal 42, and an antenna terminal 43 are provided on an eighth layer 51h. Dashed lines extending vertically in FIG. 15 represent via conductors that provide inter-layer connections between the corresponding conductor patterns.

In FIG. 15, the right half of the conductor pattern 63, and the conductor patterns 61 and 62 define a first coil element L11. The left half of the conductor pattern 63, and the conductor patterns 64 and 65 define a second coil element L12. The right half of the conductor pattern 73, and the conductor patterns 71 and 72 define a third coil element L21. The left half of the conductor pattern 73, and the conductor patterns 74 and 75 define a fourth coil element L22. The winding axes of the coil elements L11 to L22 are oriented in the lamination direction of the multilayer substrate. The winding axes of the first coil element L11 and the second coil element L12 are juxtaposed to have a different relationship. Similarly, the third coil element L21 and the fourth coil element L22 are juxtaposed so that the respective winding axes have a different relationship. The winding area of the first coil element L11 and the winding area of the third coil element L21 overlap each other at least partially in a plan view and the winding area of the second coil element L12 and the winding area of the fourth coil element L22 overlap each other at least partially in a plan view. In this preferred embodiment, the coil elements overlap each other substantially completely. In the manner described above, the four coil elements preferably include the conductor patterns having an 8-shaped structure.

It should be noted that each layer may be made of a dielectric sheet, for example. However, the use of a magnetic sheet having a high relative permeability makes it possible to further increase the coefficient of coupling between the coil elements.

Figure 16:
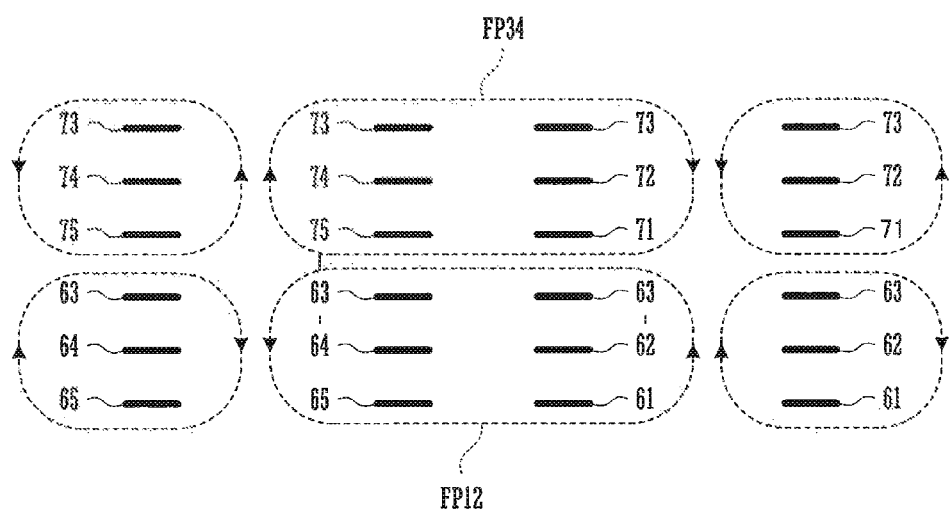
FIG. 16 is a view illustrating major magnetic fluxes that pass through coil elements having conductor patterns provided on the individual layers of the multilayer substrate illustrated in FIG. 15.

FIG. 16 is a view illustrating major magnetic fluxes that pass through coil elements having conductor patterns provided on the individual layers of the multilayer substrate illustrated in FIG. 15. A magnetic flux FP12 passes through the first coil element L11 defined by the conductor patterns 61 to 63, and the second coil element L12 defined by the conductor patterns 63 to 65. In a similar manner, a magnetic flux FP34 also passes through the third coil element L21 defined by the conductor patterns 71 to 73, and the fourth coil element L22 defined by the conductor patterns 73 to 75. In this way, the coil elements can be tightly coupled to each other.

Ninth Preferred Embodiment

Figure 17:
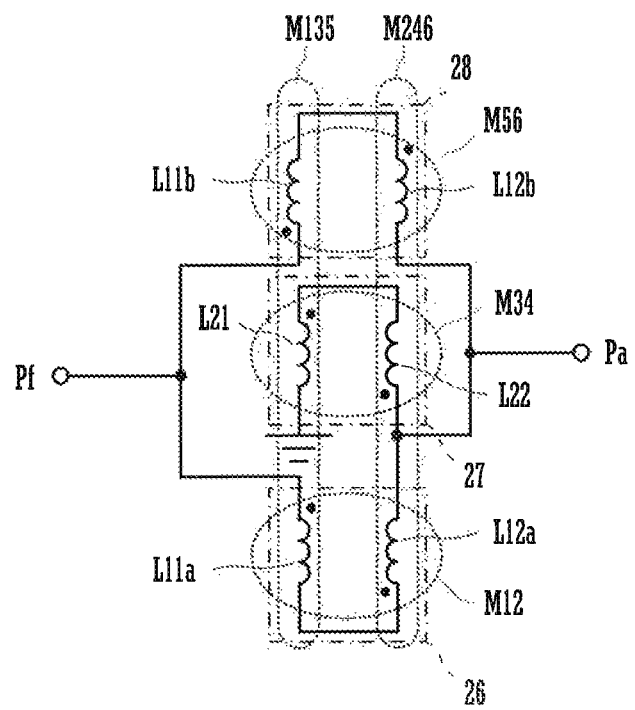
FIG. 17 is a circuit diagram of an impedance conversion circuit according to a ninth preferred embodiment of the present invention.

FIG. 17 is a circuit diagram of an impedance conversion circuit according to a ninth preferred embodiment of the present invention. This impedance conversion circuit is an impedance conversion circuit for a high band or for a low band. This impedance conversion circuit preferably includes a first series circuit 26 connected between a port Pf on a feeding side and a port Pa on an antenna side, a third series circuit 28 connected between the port Pf on the feeding side and the port Pa on the antenna side, and a second series circuit 27 connected between the port Pa on the antenna side and ground.

The first series circuit 26 is a circuit in which a first coil element L11a and a second coil element L12a are connected in series. The second series circuit 27 is a circuit in which a third coil element L21 and a fourth coil element L22 are connected in series. The third series circuit 28 is a circuit in which a fifth coil element L11b and a sixth coil element L12b are connected in series.

In FIG. 17, an elliptical dashed line M12 represents coupling between the coil elements L11a and L12a, an elliptical dashed line M34 represents coupling between the coil elements L21 and L22, and an elliptical dashed line M56 represents coupling between the coil elements L11b and L12b, respectively. An elliptical dashed line M135 also represents coupling among the coil elements L11a, L21, and L11b. Similarly, an elliptical dashed line M246 represents coupling among the coil elements L12a, L22, and L12b.

Figure 18:
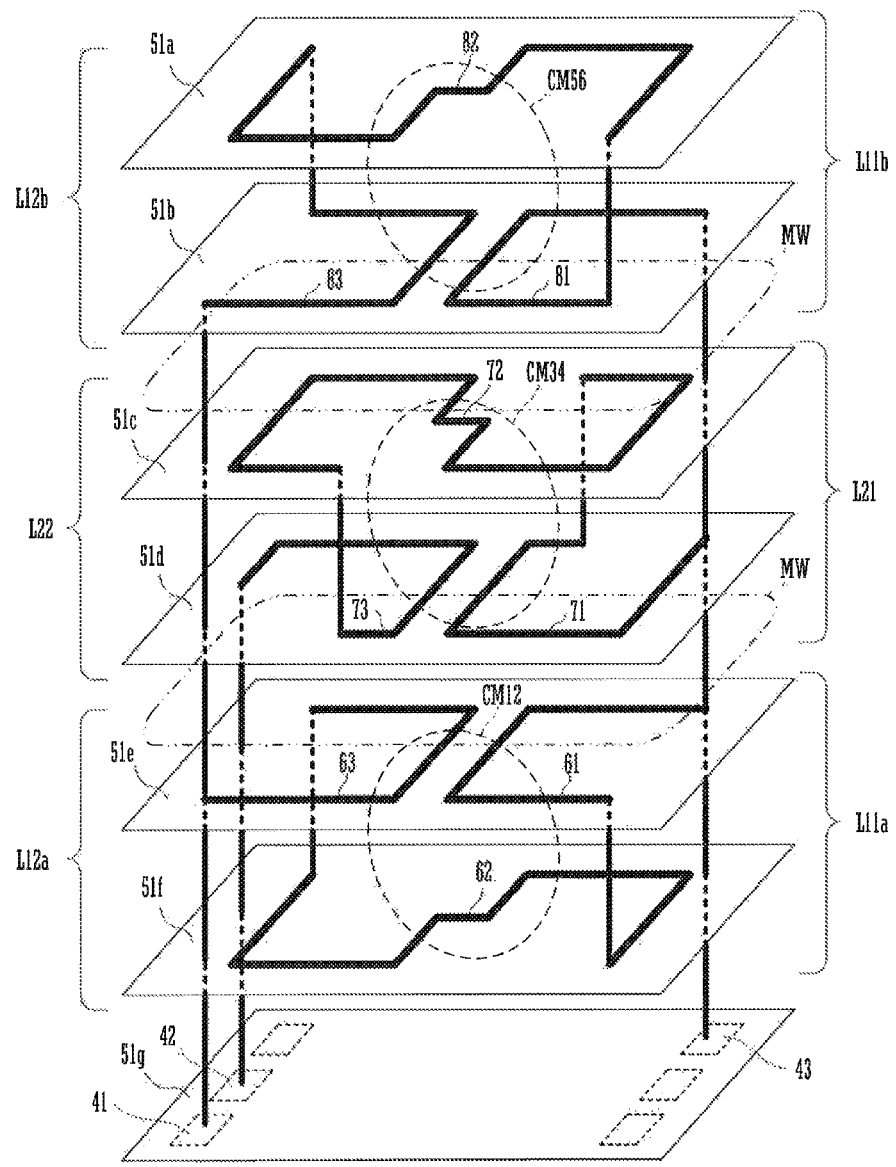
FIG. 18 is a view illustrating an example of conductor patterns of individual layers when the impedance conversion circuit according to the ninth preferred embodiment is configured in a multilayer substrate.

FIG. 18 is a view illustrating an example of conductor patterns of individual layers when the impedance conversion circuit according to the ninth preferred embodiment is configured in a multilayer substrate. Each layer of the laminate is preferably made of a magnetic sheet, for example.

In the area illustrated in FIG. 18, a conductor pattern 82 is provided on a first layer 51a, conductor patterns 81 and 83 are provided on a second layer 51b, a conductor pattern 72 is provided on a third layer 51c, respectively. Similarly, conductor patterns 71 and 73 are provided on a fourth layer 51d, conductor patterns 61 and 63 are provided on a fifth layer 51e, a conductor pattern 62 is provided on a sixth layer 51f, respectively. A feeding terminal 41, a ground terminal 42, and an antenna terminal 43 are provided on a seventh layer 51g. Dashed lines extending vertically in FIG. 18 represent via conductors that provide inter-layer connections between the corresponding conductor patterns.

In FIG. 18, the right half of the conductor pattern 62, and the conductor pattern 61 define the first coil element L11a. The left half of the conductor pattern 62, and the conductor pattern 63 define the second coil element L12a. The conductor pattern 71 and the right half of the conductor pattern 72 define the third coil element L21. The left half of the conductor pattern 72, and the conductor pattern 73 define the fourth coil element L22. The conductor pattern 81 and the right half of the conductor pattern 82 define the fifth coil element L11b. The left half of the conductor pattern 82, and the conductor pattern 83 define the sixth coil element L12b.

In FIG. 18, ellipses indicated by a dashed line represent closed magnetic circuits. A closed magnetic circuit CM12 interlinks with the coil elements L11a and L12a. In addition, a closed magnetic circuit CM34 interlinks with the coil elements L21 and L22. Furthermore, a closed magnetic circuit CM56 interlinks with the coil elements L11b and L12b. As described above, the first closed magnetic circuit CM12 preferably includes the first coil element L11a and the second coil element L12a, the second closed magnetic circuit CM34 preferably includes the third coil element L21 and the fourth coil element L22, and the third closed magnetic circuit CM56 preferably includes the fifth coil element L11b and the sixth coil element L12b. Planes indicated by a long dashed double-short dashed line in FIG. 18 represent two magnetic barriers MW that are equivalently generated since the coil elements L11a and L21, L21 and L11b, L12a and L22, and L22 and L12b are coupled to generate a magnetic flux in directions opposite to each other between the corresponding three closed magnetic circuits. In other words, the two magnetic barriers MW confine the magnetic flux of the closed magnetic circuit defined by the coil elements L11a and L12a, the magnetic flux of the closed magnetic circuit defined by the coil elements L21 and L22, and the magnetic flux of the closed magnetic circuit defined by the coil elements L11b and L12b, respectively.

As described above, the second closed magnetic circuit CM34 is structured to be sandwiched between the first closed magnetic circuit CM12 and the third closed magnetic circuit CM56 in the layer direction. With this structure, the second closed magnetic circuit CM34 is sandwiched between two magnetic barriers and is sufficiently confined (the effect of being confined is enhanced.) In other words, it is possible to cause the impedance conversion circuit according to preferred embodiments to act as a transformer having a very large coupling coefficient.

Accordingly, the distance between the closed magnetic circuits CM12 and CM34 and the distance between the closed magnetic circuits CM34 and CM56 can be increased to an extent. The circuit in which the series circuit defined by the coil elements L11a and L12b and the series circuit defined by the coil elements L11b and L12b are connected in parallel to each other is referred to as a "primary side circuit" and the series circuit defined by the coil elements L21 and L22 is referred to as a "secondary side circuit," and the increase in the distance between the closed magnetic circuits CM12 and CM34 and the distance between the closed magnetic circuits CM34 and CM56 makes it possible to reduce the capacitance generated between the first series circuit 26 and the second series circuit 27 and the capacitance generated between the second series circuit 27 and the third series circuit 28. In other words, the capacitance component of an LC resonant circuit that sets the frequency of a self-resonant point is significantly reduced.

In addition, according to the ninth preferred embodiment, since the first series circuit 26 defined by the coil elements L11a and L12a and the third series circuit 28 defined by the coil elements L11b and L12b are connected in parallel to each other, the inductance component of an LC resonant circuit that sets the frequency of the self-resonant point is reduced.

In this way, both the capacitance component and the inductance component of the LC resonant circuit that sets the frequency of the self-resonant point are reduced, so that the frequency of the self-resonant point can be set to a high frequency that is sufficiently far from a usage frequency band, and the impedance conversion circuit according to preferred embodiments acts as a transformer over a wide band.

Tenth Preferred Embodiment

Figure 19:
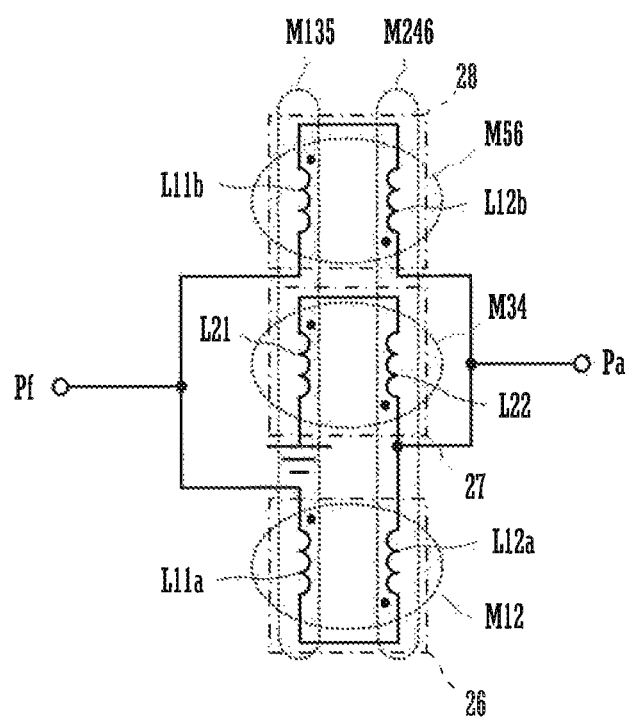
FIG. 19 is a circuit diagram of an impedance conversion circuit according to a tenth preferred embodiment of the present invention.

FIG. 19 is a circuit diagram of an impedance conversion circuit according to a tenth preferred embodiment of the present invention. This impedance conversion circuit is an impedance conversion circuit for a high band or for a low band. This impedance conversion circuit preferably includes a first series circuit 26 connected between a port Pf on a feeding side and a port Pa on an antenna side, a third series circuit 28 connected between the port Pf on the feeding side and the port Pa on the antenna side, and a second series circuit 27 connected between the port Pa on the antenna side and ground.

The first series circuit 26 is a circuit in which a first coil element L11a and a second coil element L12a are connected in series. The second series circuit 27 is a circuit in which a third coil element L21 and a fourth coil element L22 are connected in series. The third series circuit 28 is a circuit in which a fifth coil element L11b and a sixth coil element L12b are connected in series.

In FIG. 19, an elliptical dashed line M12 represents coupling between the coil elements L11a and L12a, an elliptical dashed line M34 represents coupling between the coil elements L21 and L22, and an elliptical dashed line M56 represents coupling between the coil elements L11b and L12b, respectively. An elliptical dashed line M135 also represents coupling among the coil elements L11a, L21, and L11b. Similarly, an elliptical dashed line M246 represents coupling among the coil elements L12a, L22, and L12b.

Figure 20:
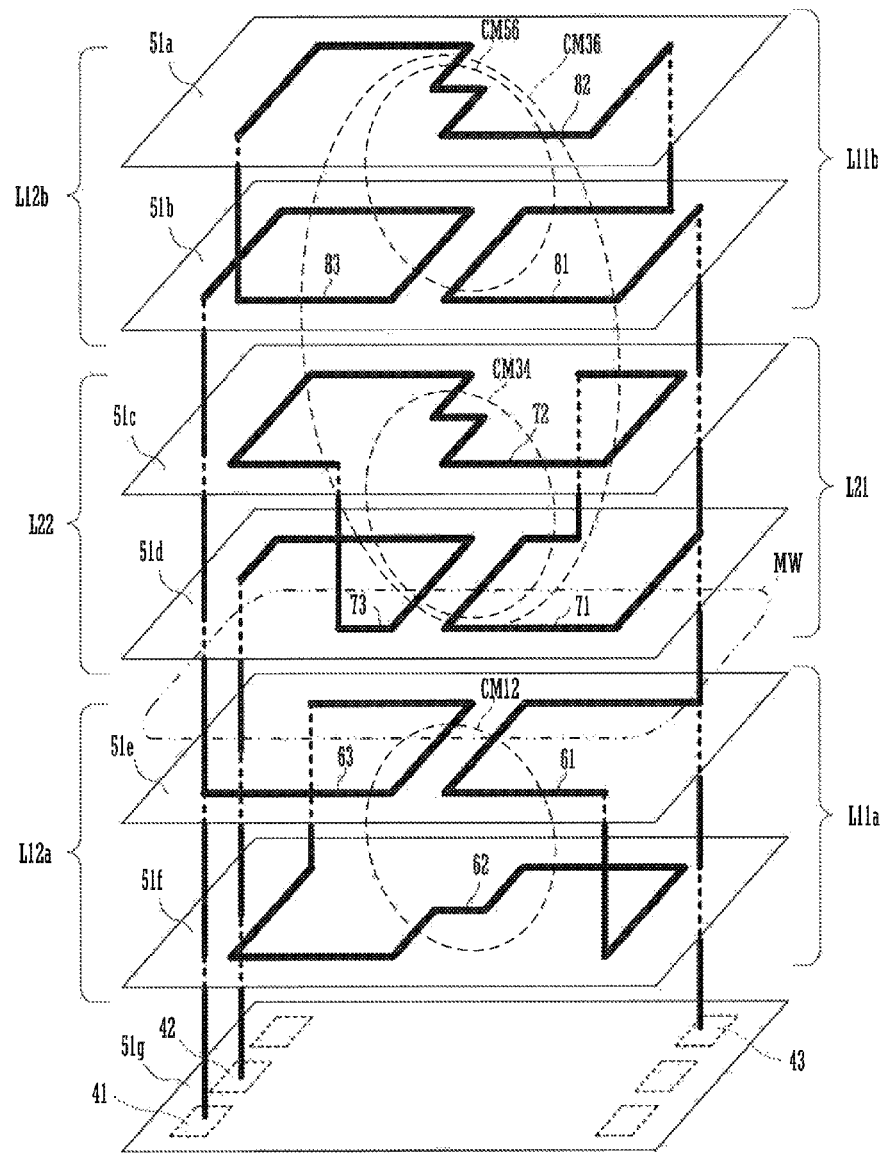
FIG. 20 is a view illustrating an example of conductor patterns of individual layers when the impedance conversion circuit according to the tenth preferred embodiment is configured in a multilayer substrate.

FIG. 20 is a view illustrating an example of conductor patterns of individual layers when the impedance conversion circuit according to the tenth preferred embodiment is configured in a multilayer substrate. Each layer may preferably be made of a magnetic sheet, for example. While the conductor patterns of individual layers, when being in the direction illustrated in FIG. 20, are provided on the magnetic sheet, each conductor pattern is indicated by a solid line. In addition, each linear conductor pattern has a predetermined line width, and is indicated by a simple solid line in this preferred embodiment.

What is different from the impedance conversion circuit illustrated in FIG. 18 is the polarity of the coil elements L11b and L12b defined by the conductor patterns 81, 82, and 83. In the example in FIG. 20, a closed magnetic circuit CM36 interlinks with the coil elements L21, L11b, L12b, and L22. Thus, no equivalent magnetic barrier is generated between the coil elements L21 and L22 and between the coil elements L11b and L12b. The other configurations are the same as the configurations described in the fifth preferred embodiment.

According to the tenth preferred embodiment, since the closed magnetic circuits CM12, CM34, and CM56 illustrated in FIG. 20 are generated and the closed magnetic circuit CM36 is also generated, the magnetic flux defined by the coil elements L21 and L22 is absorbed by the magnetic flux defined by the coil elements L11b and L12b. Thus, even with the structure of the sixth preferred embodiment, the magnetic flux hardly leaks, and consequently, it is possible to cause the structure to act as a transformer having a very large coupling coefficient.

Even in the tenth preferred embodiment, both the capacitance component and the inductance component of the LC resonant circuit that sets the frequency of the self-resonant point are reduced, so that the frequency of the self-resonant point can be set to a high frequency that is sufficiently far from a usage frequency band.

Eleventh Preferred Embodiment

In an eleventh preferred embodiment of the present invention, a description is given of another configuration example, which is different from the configurations of the ninth and tenth preferred embodiments, to increase the frequency of the self-resonant point of a transformer.

Figure 21:
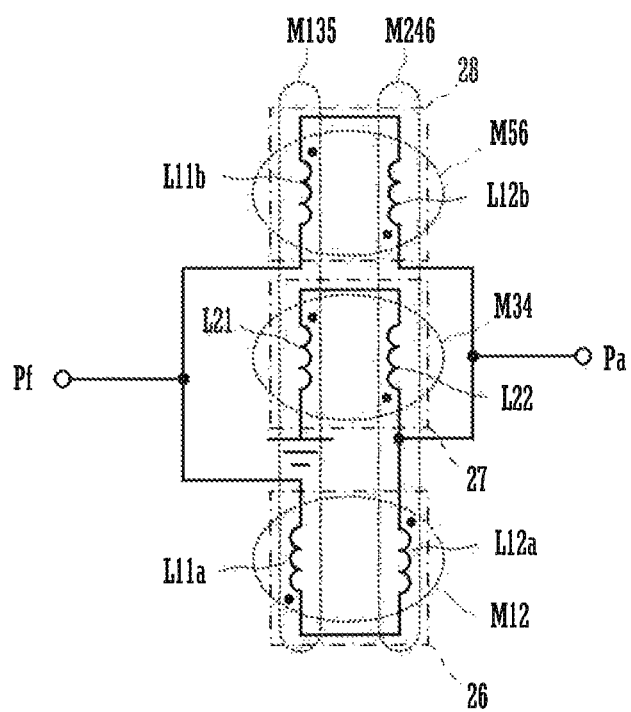
FIG. 21 is a circuit diagram of an impedance conversion circuit according to an eleventh preferred embodiment of the present invention.

FIG. 21 is a circuit diagram of an impedance conversion circuit according to the eleventh preferred embodiment. This impedance conversion circuit is an impedance conversion circuit for a high band or for a low band. This impedance conversion circuit preferably includes a first series circuit 26 connected between a port Pf on a feeding side and a port Pa on an antenna side, a third series circuit 28 connected between the port Pf on the feeding side and the port Pa on the antenna side, and a second series circuit 27 connected between the port Pa on the antenna side and ground.

Figure 22:
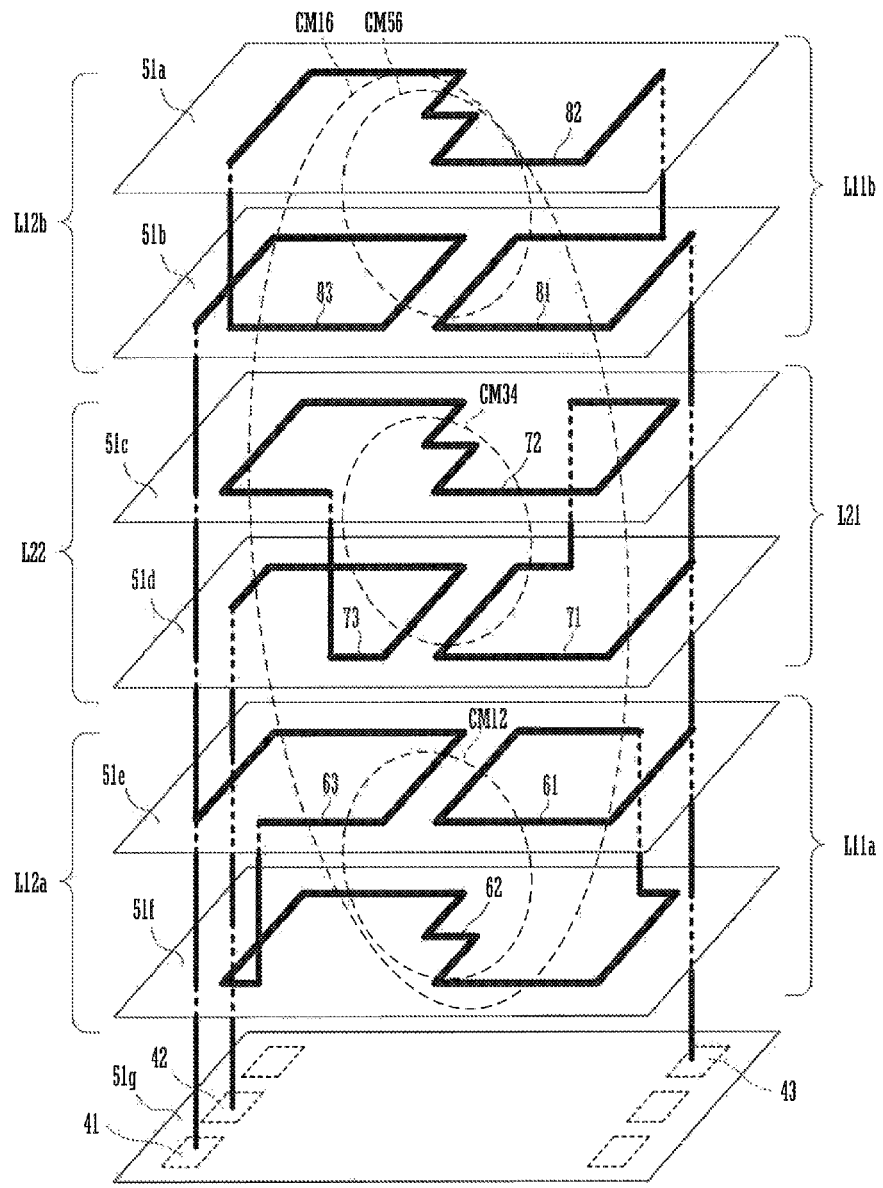
FIG. 22 is a view illustrating an example of conductor patterns of individual layers when the impedance conversion circuit according to the eleventh preferred embodiment is configured in a multilayer substrate.

FIG. 22 is a view illustrating an example of conductor patterns of individual layers when the impedance conversion circuit according to the eleventh preferred embodiment is configured in a multilayer substrate. Each layer of the laminate is preferably made of a magnetic sheet, for example.

What is different from the impedance conversion circuit illustrated in FIG. 18 is the polarity of the coil elements L11b and L12b defined by the conductor patterns 61, 62, and 63, and the polarity of the coil elements L11b and L12b defined by the conductor patterns 81, 82, and 83. In the example of FIG. 22, a closed magnetic circuit CM16 interlinks with all of the coil elements L11a to L12b. Thus, in this case, no equivalent magnetic barrier is generated. The other configurations are the same as the configurations described in the ninth preferred embodiment and the tenth preferred embodiment.

According to the eleventh preferred embodiment, since the closed magnetic circuits CM12, CM34, and CM56 illustrated in FIG. 22 are generated and the closed magnetic circuit CM16 is also generated, the magnetic flux defined by the coil elements L11a to L12b hardly leaks. As a result, it is possible to cause the impedance conversion circuit according to preferred embodiments to act as a transformer having a large coupling coefficient.

Even in the eleventh preferred embodiment, both the capacitance component and the inductance component of the LC resonant circuit that sets the frequency of the self-resonant point are reduced, so that the frequency of the self-resonant point can be set to a high frequency that is sufficiently far from a usage frequency band.

It should be noted that while the eighth to eleventh preferred embodiments describe an impedance conversion circuit for a high band or for a low band, respective impedance conversion circuits for a high band and for a low band may be in the form of a single laminate and modularized.

In addition, while the above described preferred embodiments describe, except an example illustrated in FIG. 6B, an example in which an antenna shared in a high band and a low band is provided, an antenna for a high band and an antenna for a low band may be separately provided also in these preferred embodiments.

In addition, while the above described preferred embodiments describe examples such that an impedance conversion circuit is provided with a high frequency circuit for a high band and a high frequency circuit for a low band; and an impedance conversion circuit is provided only with a high frequency circuit for a low band, the present invention may also include an example in which an impedance conversion circuit is provided with a high frequency circuit for a high band and no impedance conversion circuit is provided with a high frequency circuit for a low band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A front-end circuit comprising:
    a feeding side frequency selective circuit including:
        a feeding side common port through which a high-frequency signal in a first frequency band and a high-frequency signal in a second frequency band of which a frequency band is lower than the first frequency band are input or output;
        a first port through which the high-frequency signal in the first frequency band is input or output; and
        a second port through which the high-frequency signal in the second frequency band is input or output; wherein
        the feeding side frequency selective circuit is configured to demultiplex or multiplex the high-frequency signal in the first frequency band and the high-frequency signal in the second frequency band; and
        each of the first port and the second port is configured to be connected to an outside antenna element; and
    an impedance conversion circuit which is provided between the second port and the outside antenna element, the impedance conversion circuit including a transformer in which a primary side coil and a secondary side coil are included, the primary side coil including a first end connected to the second port, and a second end connected to the outside antenna element, the secondary side coil including a first end connected to the ground, and a second end connected to the outside antenna element, and the primary side coil and the secondary side coil being electromagnetically coupled to each other.

2. The front-end circuit according to claim 1, wherein:
    the primary side coil of the impedance conversion circuit includes a plurality of coil conductors that are arranged so as to be interconnected in series and to mutually define a closed magnetic circuit; and
    the secondary side coil of the impedance conversion circuit includes a plurality of coil conductors that are arranged so as to be interconnected in series and to mutually define a closed magnetic circuit.

3. The front-end circuit according to claim 1, wherein respective primary side coils and secondary side coils of the impedance conversion circuit are integrally arranged in a laminate including a plurality of dielectric layers or magnetic layers.

4. The front-end circuit according to claim 1, wherein the outside antenna element is a common antenna element.

5. The front-end circuit according to claim 1, further comprising an antenna side frequency selective circuit including:
    an antenna side common port through which the high-frequency signal in the first frequency band and the high-frequency signal in the second frequency band are input or output;
    a first port through which the high-frequency signal in the first frequency band is input or output; and
    a second port through which the high-frequency signal in the second frequency band is input or output; wherein
    the antenna side frequency selective circuit is configured to demultiplex or multiplex the high-frequency signal in the first frequency band and the high-frequency signal in the second frequency band.

6. The front-end circuit according to claim 1, wherein the outside antenna element includes a first outside antenna element and a second outside antenna element, the first port is connected to the first outside antenna element, and the second port is connected to the second outside antenna element.

7. A communication terminal apparatus comprising:
    a front-end circuit including:
        a feeding side frequency selective circuit including:
            a feeding side common port through which a high-frequency signal in a first frequency band and a high-frequency signal in a second frequency band of which a frequency band is lower than the first frequency band are input or output;
            a first port through which the high-frequency signal in the first frequency band is input or output; and
            a second port through which the high-frequency signal in the second frequency band is input or output; wherein
            the feeding side frequency selective circuit is configured to demultiplex or multiplex the high-frequency signal in the first frequency band and the high-frequency signal in the second frequency band; and
    an antenna element which is connected to the second port; wherein
    the front-end circuit includes an impedance conversion circuit which is provided between the second port and the antenna element, the impedance conversion circuit including a transformer in which a primary side coil and a secondary side coil are included, the primary side coil including a first end connected to the second port, and a second end connected to the antenna element, the secondary side coil including a first end connected to the ground, and a second end connected to the antenna element, and the primary side coil and the secondary side coil being electromagnetically coupled to each other.

8. The communication terminal apparatus according to claim 7, wherein:
    the primary side coil of the impedance conversion circuit includes a plurality of coil conductors that are arranged so as to be interconnected in series and to mutually define a closed magnetic circuit; and
    the secondary side coil of the impedance conversion circuit includes a plurality of coil conductors that are arranged so as to be interconnected in series and to mutually define a closed magnetic circuit.

9. The communication terminal apparatus according to claim 7, wherein the antenna element is a common antenna element.

10. The communication terminal apparatus according to claim 7, wherein respective primary side coils and secondary side coils of the impedance conversion circuit are integrally arranged in a laminate including a plurality of dielectric layers or magnetic layers.

11. The communication terminal apparatus according to claim 7, further comprising an antenna side frequency selective circuit including:
    an antenna side common port through which the high-frequency signal in the first frequency band and the high-frequency signal in the second frequency band are input or output;
    a first port through which the high-frequency signal in the first frequency band is input or output; and a second port through which the high-frequency signal in the second frequency band is input or output; wherein
the antenna side frequency selective circuit is configured to demultiplex or multiplex the high-frequency signal in the first frequency band and the high-frequency signal in the second frequency band.

* * * * *